(12) United States Patent
Naem

(10) Patent No.: US 6,586,298 B1
(45) Date of Patent: Jul. 1, 2003

(54) METHOD OF FORMING HIGH PERFORMANCE BIPOLAR TRANSISTOR

(75) Inventor: Abdalla Naem, Overiise (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/244,877

(22) Filed: Sep. 17, 2002

Related U.S. Application Data

(62) Division of application No. 10/067,561, filed on Feb. 4, 2002, now Pat. No. 6,528,861.
(60) Provisional application No. 60/298,649, filed on Jun. 15, 2001.

(51) Int. Cl.[7] .............................................. H01L 21/331
(52) U.S. Cl. ......................... 438/235; 438/312; 438/317
(58) Field of Search ................................ 438/235, 312, 438/317, 341, 35

(56) References Cited

U.S. PATENT DOCUMENTS

| | | | |
|---|---|---|---|
| 4,916,083 A | 4/1990 | Monkowski et al. | 437/31 |
| 5,204,275 A | 4/1993 | Lane | 437/31 |
| 5,508,213 A | 4/1996 | Van Der Wel et al. | 437/31 |
| 6,310,368 B1 * | 10/2001 | Yagura | |
| 6,319,786 B1 * | 11/2001 | Gris | |
| 6,380,017 B1 | 4/2002 | Darwish et al. | 438/202 |
| 6,399,455 B1 | 6/2002 | Naem | 438/369 |
| 6,534,802 * | 3/2003 | Schuegraf | |

OTHER PUBLICATIONS

Wim van der Wel et al. "Poly–Ridge Emitter Transistor (PRET): Simple Low–Power Option to a Bipolar Process", 1993 IEEE, pp. 17.6.1 to 17.6.4.

* cited by examiner

*Primary Examiner*—Stephen D. Meier
(74) *Attorney, Agent, or Firm*—Stallman & Pollock LLP

(57) ABSTRACT

A method of fabricating a bipolar transistor structure is provided in which a blanket silicon-germanium (SiGe) film is used in a self-aligned manner to form the active base region of the bipolar device, thereby eliminating the need for a complicated selective SiGe process.

3 Claims, 4 Drawing Sheets

METHOD OF FORMING HIGH PERFORMANCE BIPOLAR TRANSISTOR

RELATED APPLICATION

This application is a divisional of application Ser. No. 10/067,561, filed Feb. 4, 2002, now U.S. Pat. No. 6,528,861, which claims the benefit of U.S. Provisional application Ser. No. 60/298,649, filed Jun. 15, 2001, titled "High Performance Bipolar Transistor Architecture and Method of Forming the Transistor," which provisional application is hereby incorporated by reference.

BACKGROUND OF THE INVENTION

1. Field of the Invention

The present invention relates to bipolar transistors and, in particular, to a bipolar transistor having an ultra-small, self-aligned polysilicon emitter and an active base region formed utilizing deposition of a blanket silicon-germanium (SiGe) film that is self-aligned to the base window.

2. Description of the Related Art

A bipolar transistor is a three-terminal device that can, when properly biased, controllably vary the magnitude of the current that flows between two of the terminals. The three terminals include a base terminal, a collector terminal and an emitter terminal. The charge carriers, which form the current, flow between the collector and the emitter terminals, while variations in the voltage on the base terminal cause the magnitude of the current to vary.

Due to the increasing demand for battery-powered devices, there is a need for a bipolar transistor that utilizes less power. Lower power consumption can be obtained by reducing the maximum current that can flow between the two terminals. One approach for reducing the maximum current is to reduce the size of the base-to-emitter junction, preferably to sub-lithographic feature sizes.

FIG. 1 shows a portion of a prior-art bipolar transistor 100 that has a base-to-emitter junction with a sub-lithographic width. As shown in FIG. 1, transistor 100 includes a collector layer 110, a base layer 112 that is formed on the collector layer 110, and a field oxide region FOX that adjoins layer 112. In addition, transistor 100 includes a thin oxide layer 114 that is formed on a portion of base layer 112 and the field oxide region FOX, and an n+ extrinsic emitter 116 that is formed on the thin oxide layer 114.

Transistor 100 additionally includes a base silicide contact 122 that is formed on base layer 112 and an emitter silicide contact 124 that is formed on extrinsic emitter 116. In addition, an oxide spacer 126 is formed on base layer 112 between poly ridge 120 and base contact 122.

During fabrication, poly ridge 120 is formed to have a maximum width (measured laterally) that is smaller than the minimum feature size that is obtainable with a give photolithographic process. After poly ridge 120 has been formed, emitter region 118 is formed during an annealing step that causes dopants to outdiffuse from poly ridge 120 into base layer 112. As a result, a very small base-to-emitter junction results. A small base-to-emitter junction limits the magnitude of the current that can flow through transistor 100. Reducing current, in turn, provides low-power operation.

(See "Poly Emitter Transistor (PRET): Simple Low Power Option to a Bipolar Process," Wim van der Wel, et al., IEDM 93-453, 1993, pp. 17.6.1–17.6.4.)

One drawback associated with bipolar transistor 100, however, is that it requires the added cost and complexity of a double polysilicon process (extrinsic emitter 116 is formed from a first polysilicon (poly-1) layer, while poly ridge 120 is formed from a second polysilicon (poly-2)layer.) In addition, emitter dopant diffusion into base 112 can be less, compared to a conventional single-poly device architecture, due to the possible presence of oxide at the poly 1-to-poly 2 interface (emitter 116 to poly ridge 120 interface).

Another drawback of transistor 100 is that, although FIG. 1 shows oxide spacer 126 formed on poly ridge 120, in actual practice, it is difficult to form an oxide sidewall spacer on a sloped surface. Gaps can result which, in turn, can lead to an electrical short circuit between base layer 112 and extrinsic emitter 116 following the silicidation process (the process that forms base silicide contact 122 and emitter silicide contact 124.). Silicide is not formed on oxide. Thus, it is critical that a uniformly thick layer of oxide (space 126) separate base layer 112 from extrinsic emitter 116.

A further drawback of transistor 100 is that the slope of the end wall of extrinsic emitter 116 can effect the width of poly ridge 120. Although FIG. 1 shows extrinsic emitter 116 with a vertical end wall, in actual practice, the end wall is often non-vertical and non-uniform across a wafer that has a number of bipolar transistors having varying performances.

An additional drawback of transistor 100 is that poly ridge 120 is formed around and in contact with each sidewall of extrinsic emitter 116. A plan view of extrinsic emitter 116 would show emitter 116 with a square or rectangle shape with poly ridge 120 surrounding emitter 116. As a result, transistor 100 has a large base-to-emitter contact area and a high base-to-emitter capacitance.

Thus, there is a need for a low-power bipolar transistor with a sub-lithographic base-to-emitter junction that reduces, or preferably eliminates, the previously-described drawback.

U.S. patent application Ser. No. 09/881,904, filed on Jun. 15, 2001 (the same day as the above-referenced provisional application from which this application claims priority), and titled "Bipolar Transistor Width Ultra Small Self-Aligned Polysilicon Emitter and Method of Forming the Transistor," discloses a bipolar transistor that is formed with a single polysilicon process, and has a substantially vertical end wall. The vertical end wall allows a standard oxide side-wall spacer to be formed adjacent to the extrinsic emitter, thereby reducing the likelihood of any base-to-emitter short circuits.

In addition, the bipolar transistor disclosed in the above-cited application provides a sub-lithographic emitter region that reduces the maximum current that can flow through the transistor, thereby reducing the power consumption and also reducing the base-to-emitter capacitance by limiting the base-to-emitter contact area.

The disclosed bipolar transistor is formed on a wafer that has a buried layer, an epitaxial layer of a first conductivity type that is formed over the buried layer, and an intrinsic base region of a second conductivity type that is formed in the epitaxial layer. The epitaxial layer has a smaller dopant concentration than the buried layer. An isolation region is formed on the surface of the intrinsic region. The transistor also has an extrinsic emitter region that is formed on the isolation region and the extrinsic base region. The sidewall of the extrinsic emitter region is substantially aligned with the sidewall of the isolation region. In addition, the region of the extrinsic emitter that contacts the intrinsic base has a sub-lithographic feature size. An intrinsic emitter region is formed in the intrinsic base region. The intrinsic emitter region contacts the extrinsic emitter region. The transistor additionally has an isolation spacer that is formed on the intrinsic base region to contact the extrinsic emitter.

FIG. 2 shows a portion of the disclosed low-power bipolar transistor 200. As shown in FIG. 2, transistor 200 is formed on a wafer that has an n+ buried layer 210, and n– epitaxial layer 212 that is formed over n_buried layer 210, and a field oxide region FOX that adjoins layer 212 N+buried layer 210 and n– epitaxial 212 form the collector of transistor 200. Transistor 200 includes a p– intrinsic base 216 that is formed in n– epitaxial layer 212. In addition, transistor 200 includes an n+ intrinsic emitter region 220 that is formed in p–intrinsic base 216, and a layer of isolation material 222 that is formed on intrinsic base 216 and the field oxide region FOX. Transistor 200 further includes and extrinsic emitter 224 that is formed on isolation layer 222, and an oxide spacer 226 that is formed on base 216 adjacent to extrinsic emitter 224. Transistor 200 also includes a base silicide layer 228 that is formed on base 216, and an emitter silicide layer 230 that is formed on extrinsic emitter 224. Isolation layer 222 and extrinsic emitter 224 in the present invention are formed to have substantially aligned side walls (in the plane parallel to the page). Further, the method of the present invention forms extrinsic emitter 224 such that an end region 232 of emitter 224 has a width WD that is less than the minimum feature size that can be obtained from the photolithographic process used to form the wafer. This allows intrinsic emitter region 220 to be very small which, in turn, reduces the size of the base-to-emitter junction. In addition, extrinsic emitter 224 is formed to have a vertical end wall 234. The advantage of vertical end wall 234 is that conventional (full height and width) oxide side-wall spacer can then be formed next to vertical end wall 234, thereby providing the necessary base-to-emitter isolation. In addition, vertical end wall 234 minimizes the variability of width WD.

SUMMARY OF THE INVENTION

The present invention provides a method of fabricating a bipolar transistor structure that provides certain advantages over the prior art. Specifically, a blanket silicon germanium (SiGe) film is used in a self-aligned manner to form the active base region of the bipolar transistor, thus eliminating the need for a complicated selective SiGe process. The use of blanket SiGe in this manner requires recessing the silicon substrate surface in the active base region. The present method allows the SiGe film to be self-aligned to the base window and, hence, there is zero parasitic overlap between the emitter area and the base region. Therefore, the emitter-base capacitance is very much minimized, thereby enhancing the device performance significantly. A nitride sidewall spacer is formed on sidewalls of the emitter polysilicon in such a way that the SiGe region film is not attacked during the sidewall spacer formation. The sidewall spacer is formed using a combination of oxide and nitride films, which results in a full height and width of the spacer.

The present architecture avoids major manufacturing issues associated with similar prior art. The method allows the formation of a very small emitter area (as small as 0.15 um X 0.05 um) using conventional lithographic and fabrication techniques.

The new bipolar device architecture provided by the present invention minimizes emitter area and is photolithographic independent. It provides a single poly emitter with a high dopant concentration (contrary to PRET). The simple blanket SiGe deposition process can be used and made perfectly self-aligned to the base window without requiring masking step. As stated above, the sidewall spacers have a full height and width due to the use of a combined oxide and nitride spacer, the etching of the base region during the deposition of the sidewall spacer in eliminated in this architecture, which minimizes the erosion of the base region. However, the selectivity of the poly-emitter etching with respect to the base SiGe may be an issue.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

Figure 1:
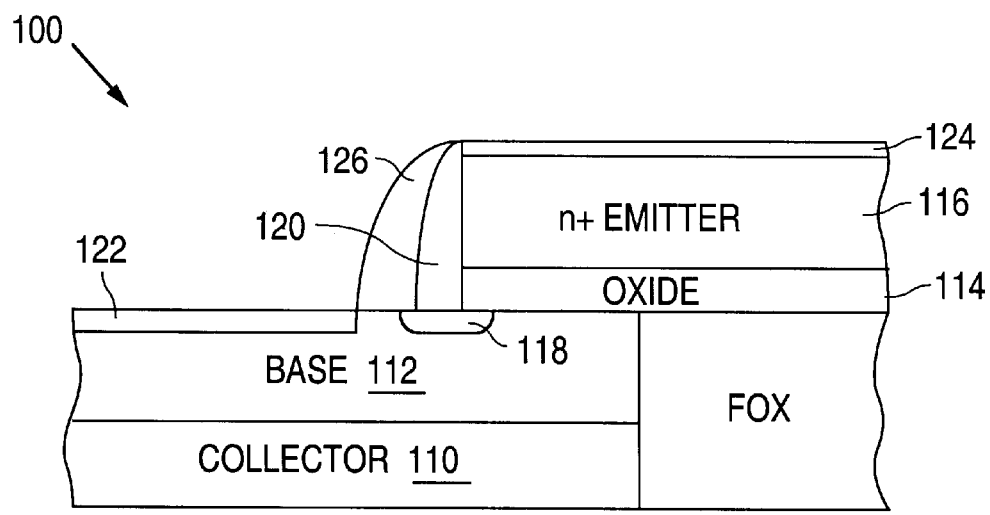
FIG. 1 is a partial cross-section drawing illustrating a portion of a prior art bipolar transistor having a base-to-emitter junction with a sub-lithographic width.
Figure 2:
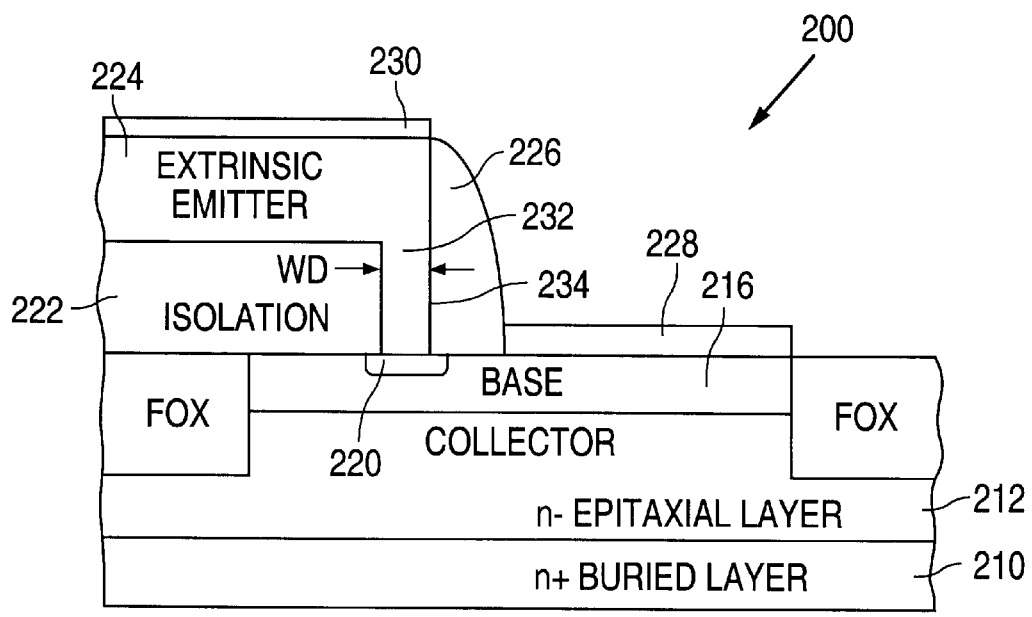
FIG. 2 is a partial cross-section drawing illustrating a low power bipolar transistor having an ultra-small, self-aligned emitter.
Figure 3A:
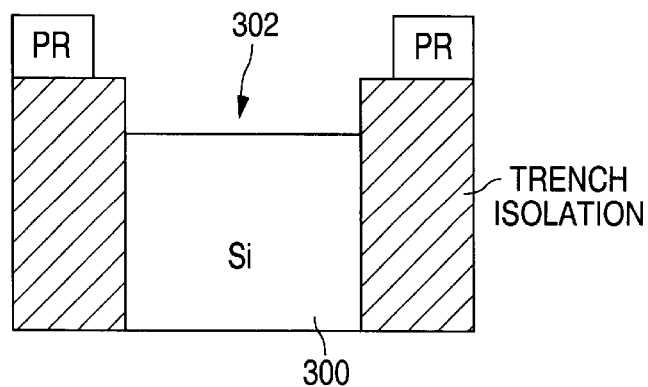
FIGS. 3A–3I are partial cross-section drawings illustrating a sequence of steps in a method of forming a bipolar transistor structure in accordance with the concepts of the present invention.

Referring to FIG. 3A, a preferred embodiment of a fabrication technique in accordance with the present invention begins with the formation of a recessed region 302 in the trench isolated active device region of a silicon substrate 300 using conventional photoresist (PR) lithographic and etch steps to remove,.for example, about 500 Angstroms of the silicon 300 by etching in the based region using a hard mask.

Figure 3B:
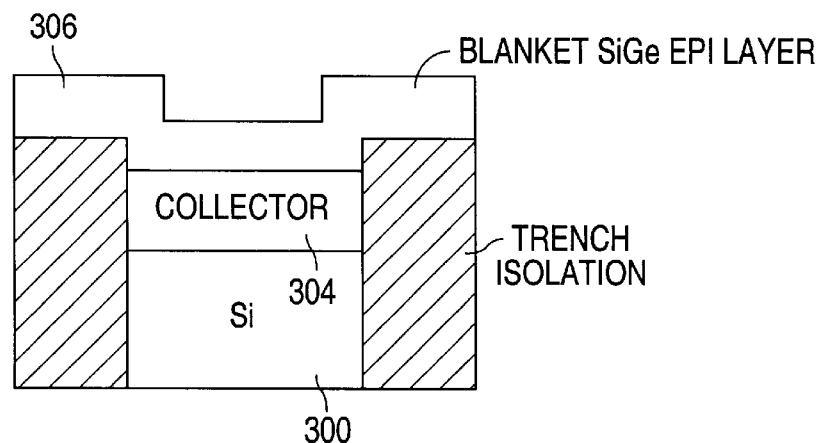
Figure 3C:
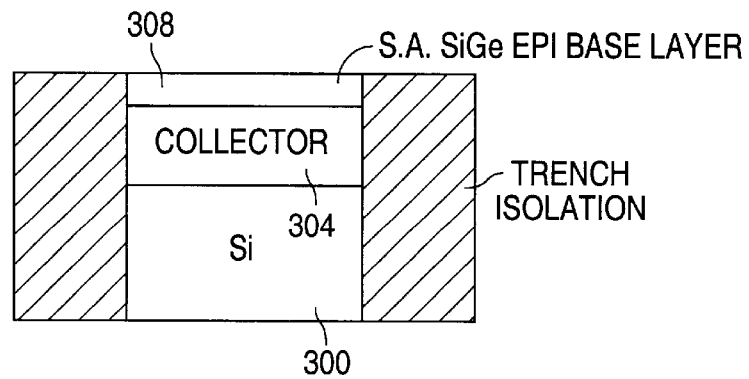

As shown in FIG. 3B, after formation of a collector region 304 in the silicon substrate 300 by conventional doping techniques, a blanket silicon germanium (SiGe) epitaxial layer 306 is deposited. The formation of the blanket SiGe epitaxial layer 306 is followed by a chemical mechanical polishing (CMP) step that removes SiGe material from the trench isolation regions, allowing the self-aligned definition of the SiGe film 308 which is confined to the active base window, as shown in FIG. 3C. Formation of the SiGe region 308 in this manner eliminates the need for the conventional, and very complex, selective deposition process.

Figure 3D:
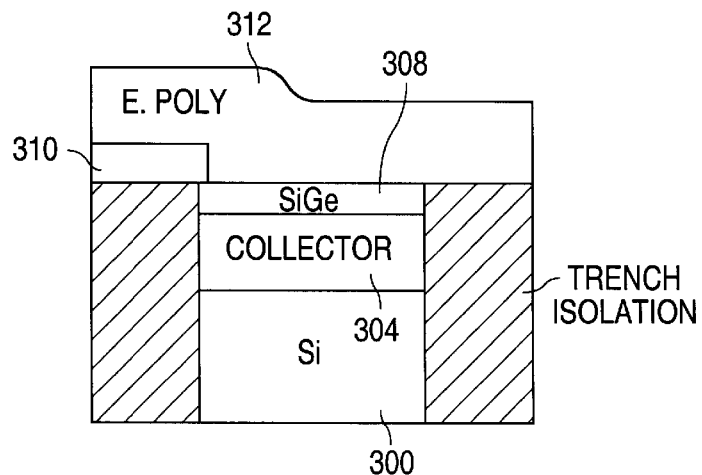
Figure 3E:
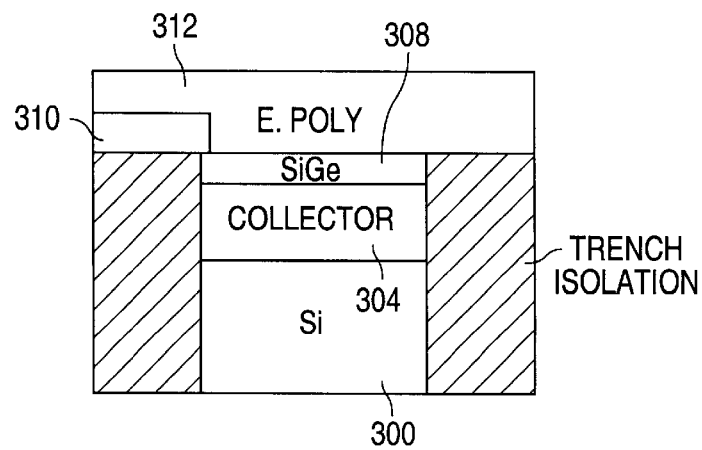

FIG. 3D shows deposition and definition of a thin (20 nm) oxide layer 310 that extends into the base region to form a pad under a polysilicon emitter layer 312. The thick, doped emitter polysilicon layer 312, approximately 250 nm thick, is deposited on the pad oxide layer 310. As shown in FIG. 3E, optionally, a CMP is then performed to thin down and to level the emitter polysilicon layer 312.

Figure 3F:
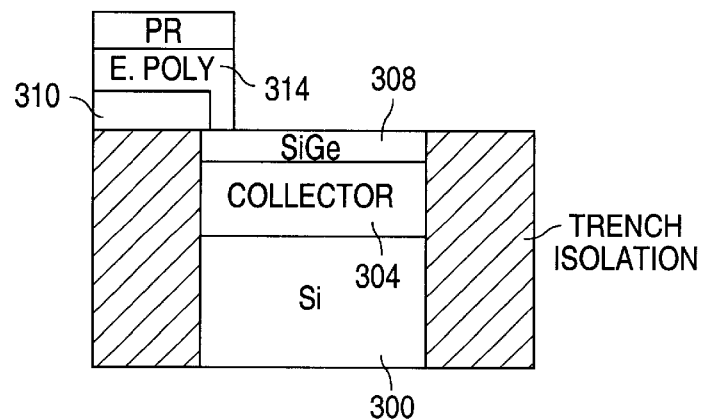
Figure 3G:
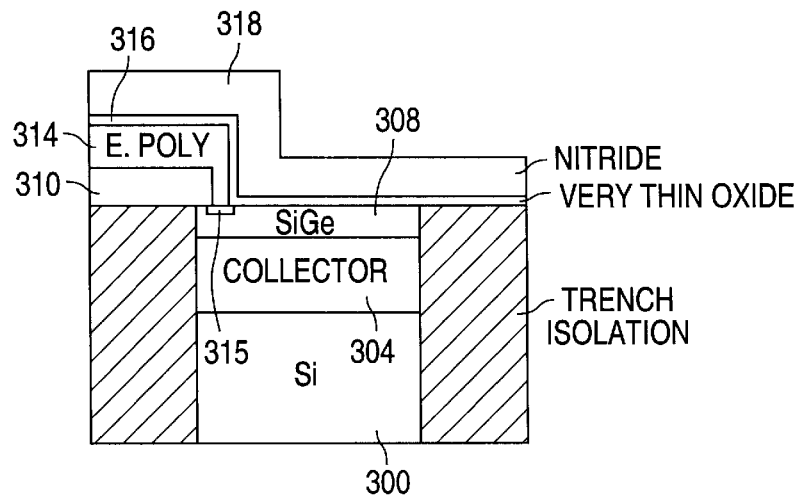

FIG. 3F shows definition of the polysilicon emitter region 314 of the bipolar transistor by conventional photoresist (PR) lithography and etch steps in such a way that the poly emitter 314 forms a ridge that extends approximately 100 nm beyond the edge of the thin pad oxide layer 310. Definition of the poly emitter 314 is followed by a photoresist strip step and a polysilicon emitter anneal step to diffuse the dopant out of the polysilicon emitter 314 in order to form an emitter-base junction 315. Following this sequence, a very thin oxide-layer 316, approximately 10 nm thick, is deposited, followed by deposition of a nitride layer 318 approximately 60 nm thick, resulting in the structure shown in FIG. 3G.

Figure 3H:
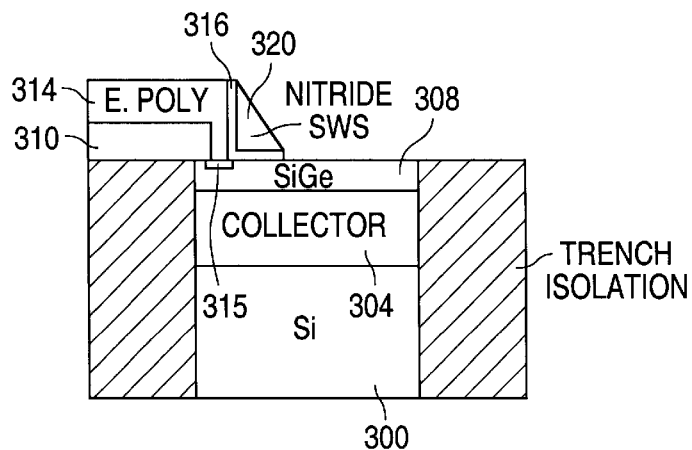

Referring to FIG. 3H, an anisotropic dry etch of the nitride layer 318 is performed to form nitride sidewall spacers (SWS) 320, using the thin oxide 316 as an etch stop layer. The exposed portions of the thin oxide layer 316 are then removed by a conventional wet etch step; by using a wet etch, the SiGe base region 308 will not be attacked by the sidewall spacer formation, thus solving a major problem presented by prior art processes. The composite sidewall spacer also prevents shorting between the emitter region and the base region.

Figure 3I:
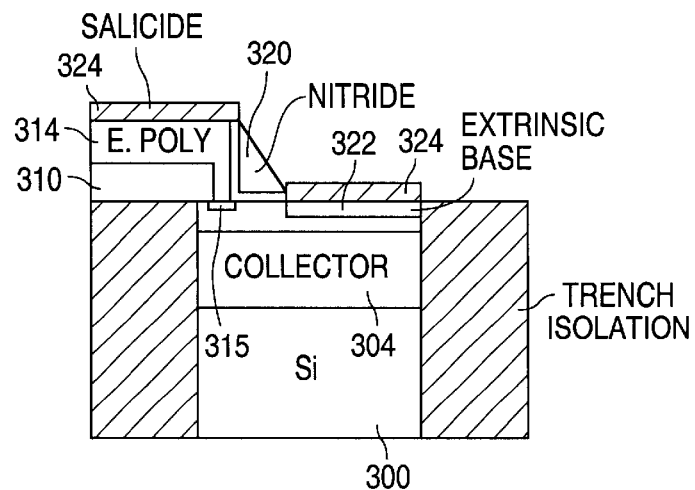

Referring to FIG. 3I, an extrinsic base region 322 is then formed by ion implantation, thereby reducing the base resistance. Salicide 324 is then formed on the exposed silicon surfaces of the emitter, base and collector.

The remainder of the fabrication process is performed utilizing conventional techniques.

It should be understood that various alternatives to the method of the invention described herein may be employed in practicing the invention. For example, although the invention is described with respect to npn bipolar transistors, the method applies equally well to pnp bipolar transistors where the conductivity types are reversed. In addition, methods in accordance with the present invention can be incorporated into a BiCMOS process. Thus, it is intended that the following claims define the scope of the invention and that methods and structures within the scope of these claims and their equivalents be covered thereby.

What is claimed is:

1. A method of a fabricating a bipolar transistor structure in a semiconductor substrate that includes a substrate active device region, a dielectric isolation structure formed at the periphery of the active device region, the method comprising:

removing an upper portion of the active device region to define an upper surface region of the active device such that a recess is defined above the upper surface region;

introducing dopant into the upper surface region to define a collector region having a first conductivity type;

depositing a epitaxial layer of silicon-germanium (SiGe) that fills the recess above the upper surface region;

planarizing the SiGe epitaxial layer such that an upper surface of the SiGe epitaxial layer is substantially coplanar with an upper surface of the dielectric isolation structure, the planarized SiGe epitaxial layer defining a base region;

forming a pad of dielectric material that extends from an edge of the dielectric isolation structure over a first portion of the base region such that a second portion of the base region is exposed;

forming a layer of doped emitter polysilicon over the pad of dielectric material and the exposed second portion of the base region;

patterning the layer of emitter polysilicon to define a ridge of emitter polysilicon having the first conductivity type and forms a ridge that extends beyond an edge of the pad of dielectric material, the ridge being in contact with the base regions;

causing dopant to diffuse from the emitter polysilicon ridge into the base region to define an emitter-base junction in the base region;

forming an oxide layer over the structure resulting from the foregoing steps;

forming a layer of silicon nitride on the oxide layer;

anisotropically etching the silicon nitride layer to stop on the oxide layer,
    whereby defining a silicon nitride sidewall spacer at an edge of the emitter polysilicon ridge and spaced-apart wherefrom by an intervening portion of the oxide layer; and removing exposed portions of the oxide layer.

2. A method as in claim 1, and wherein the semiconductor substrate comprises silicon and the dielectric isolation structure comprises a silicon oxide trench isolation structure.

3. A method as in claim 2, and wherein the pad of dielectric material comprises a silicon oxide pad.

\* \* \* \* \*